United States Statutory Invention Registration [19]

[11] Reg. Number: H28

Addamiano [45] Published: Feb. 4, 1986

[54] CHEMICAL VAPOR DEPOSITION (CVD) OF CUBIC SILICON CARBIDE SIC

[75] Inventor: Arrigo Addamiano, Alexandria, Va.

[73] Assignee: The Government of the United States, Washington, D.C.

[21] Appl. No.: 752,290

[22] Filed: Jul. 3, 1985

[51] Int. Cl.[4] ..... B44C 1/22; C09K 13/06

[52] U.S. Cl. ..... 156/612; 156/662; 252/79.4

[56] References Cited

PUBLICATIONS

"Chemically-Formed Buffer Layers for Growth of Cubic Silicon Carbide on Silicon Carbide on Silicon Single Crystals" Arrigo Addamiano and Philipp Klein, NRL, Paper presented at ACCG-6 Meeting, Atlantic City, N.J., Jul. 17 and 19, 1984.

"Reproducible Preparation of Cubic-SiC Single Crystals by Chemical Vapor Deposition," Shigehiro Nishino, Hajime Suhara and Hiroyuki Matsunami, Kyoto University, Kyoto 606, Japan, Abstract of the 15th Conference on Solid State Devices & Materials, Tokyo 1983, pp. 317-320.

"Buffer-layer" technique for the growth of single crystal SiC on Si," A. Addamiano and J. A. Sprague, NRL, Wash., DC Appl. Phys. Lett. 44 (5) 3/1/84.

*Primary Examiner*—John F. Terapane
*Assistant Examiner*—Howard J. Locker
*Attorney, Agent or Firm*—William T. Ellis; Robert F. Beers; Ansel M. Schwartz

[57] ABSTRACT

A method for chemical vapor deposition (CVD) of cubic Silicon Carbide (SiC) comprising the steps of etching silicon substrates having one mechanically polished face; depositing a thin buffer layer of cubic SiC formed by reaction between a heated Si substrate and a $H_2$ $C_3H_8$ gas mixture; and depositing SiC on the buffer layer at high temperature using $H_2+C_3H_8+SiH_4$ mixture.

3 Claims, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

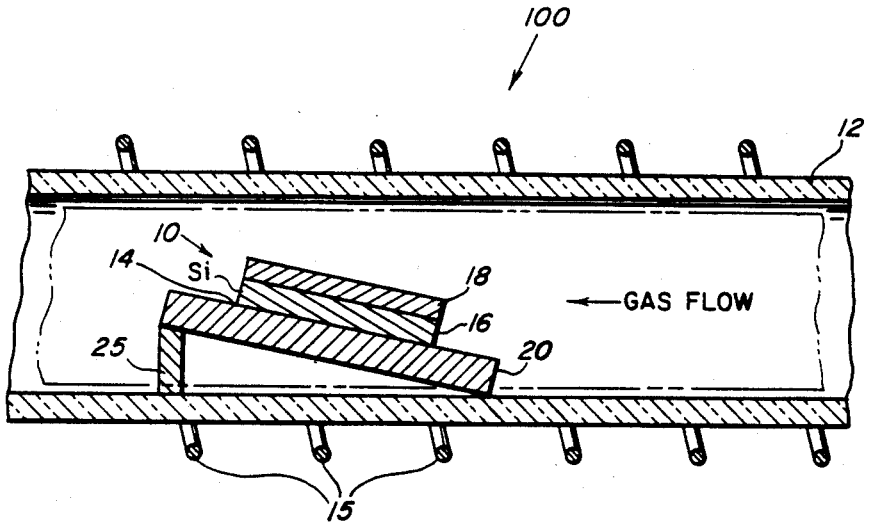
100
12
10
14
Si
18
16
GAS FLOW
25
20
15

CHEMICAL VAPOR DEPOSITION (CVD) OF CUBIC SILICON CARBIDE SIC

BACKGROUND OF THE INVENTION

The present invention relates to the growth of cubic silicon carbide crystals. More specifically, the present invention relates to the growth of cubic silicon carbide by Chemical Vapor Deposition (CVD).

A great need has developed to produce high-temperature electronic devices for advanced turbine engines, geothermal wells, and other applications. Cubic silicon carbide (SiC) is considered an excellent candidate for use as a high temperature electronic material because of its large band gap, good carrier mobility and excellent physical stability. A primary reason, though, why development of cubic SiC has not been carried further is the lack of a reproducible process for producing the single crystal substrates necessary for device fabrication.

A method that attempts to remedy this problem is presented by S. Nishino, J. A. Powell, and H. A. Will, "Production of large-area single-crystal wafers of cubic SiC for semiconductor devices," Appl. Phys. Lett. Vol. 42, No. 5, Pages 460–462, March 1983. However, the method of Nishino et al. results in cubic SiC crystals that are not of a high purity and have poor duplicability. (See A. Addamiano and J. A. Sprague, "Buffer-layer technique for the growth of single crystal SiC on Si," Appl. Phys. Lett. Vol. 44, No. 5, March 1984).

There are several reasons why the method of Nishino et al. is not adequate. Nishino et al. teach etching of the Si substrates, on which the cubic SiC crystals are grown in the apparatus used for the CVD, using hydrogen chloride (HCl) vapor at a temperature of about 1200° C. Etching of the substrates in the CVD reactor with hot HCl vapor results in considerable erosion of the graphite susceptor housing the Si substrates. This, in turn, results in random deposition of carbon particles on the Si substrates, with the consequence that there is poor duplicability of the results and impurities are introduced into the cubic SiC as it is grown. Another reason the method of Nishino et al. is not adequate is because in the formation of a buffer layer of cubic SiC on the Si substrate Nishino et al. teach mixing $H_2$ and $C_3H_8$ at room temperature, flowing the mixture over the Si substrates at room temperature, then bringing the temperature to 1360° C. and maintaining the temperature for about 1 minute, followed by cooling. The buffer layers formed by this technique are stated to be mainly polycrystalline cubic SiC, by Nishino et al., supra. This is because $C_3H_8$ is present throughout the heating step causing different growth conditions for cubic SiC that forms as the temperature is raised from room temperature to 1360° C.

Nishino et al. also teach to carry out CVD on the buffer layers at a temperature of about 1360° C. This temperature is not the ideal temperature for formation of perfect cubic single crystal layers.

SUMMARY OF THE INVENTION

Accordingly, one object of the present invention is to provide a novel method for the production of cubic SiC for high temperature electronic devices.

Another object of the present invention is to provide a novel method for the production of highly pure, single crystal cubic SiC that is duplicable.

Another object of the present invention is to provide a novel method for the production of large-area single-crystal wafers of cubic SiC.

These and other objects of the present invention can be achieved by a method for producing large-area cubic SiC wafers comprising the steps of wet-etching an Si substrate for 10–60 seconds; heating the Si substrate to between 1370° C. and 1405° C. in $H_2$ gas; exposing the Si substrate to $C_3H_8$ for 5–30 seconds, after temperature equilibrium in the heating step has been reached, to form a buffer layer of single crystal cubic SiC on the Si substrate, the amount of $C_3H_8$ being no greater than 1 percent by volume of the $H_2$ gas; quenching the Si substrate having a cubic SiC buffer layer in $H_2$ to room temperature; heating the Si substrate with the SiC buffer layer to between 1370° C. and 1405° C. in $H_2$ gas; exposing the Si substrate having the buffer layer to $C_3H_8$ *and* $SiH_4$, after thermal equilibrium has been reached for 0.25 to 5 hours to make a thicker layer of cubic SiC, the amount of $C_3H_8$ and $SiH_4$ each being no greater than 1 percent by volume of the $H_2$ gas; quenching the Si substrate having the thicker layer of SiC in $H_2$ gas to room temperature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein:

FIG. 1 is a side view of the apparatus for cubic SiC growth via the CVD process.

DESCRIPTION OF PREFERRED EMBODIMENTS

Referring now to the drawing, wherein like reference numerals designate identical or corresponding parts throughout the several views, and more particularly to FIG. 1 thereof, there is shown an Si wafer (16) of structure (100), e.g., for the preparation of a preform 10 comprised of a layer of cubic SiC 18 deposited atop said highly pure wafer of Si 16. The Si layer 16 during the preparation of the perform is rested atop a graphite susceptor 20 located inside a fused quartz tube 12 and surrounded by an induction coil 15. The induction coil 15 raises the temperature of the graphite susceptor near the Si wafer to about 1400° C. causing a gas mixture that has been introduced upstream into the tube 12, to chemically react and deposit the layer of cubic SiC 18 on the Si wafer 16.

More specifically, CVD is begun by wet etching the silicon substrate prior to its insertion in the reactor 12 followed by rinsing in de-ionized water and drying. The etchant used is a mixture of nitric, hydroflouric and acetic acid usually in the volume ratio 5:3:3, respectively. The etchant is used at room temperature, and the etching time is 10–60 seconds, and preferably 30 seconds.

After the etching process is completed, the Si wafer 16 is placed atop a graphite susceptor 20 located inside a fused quartz tube 12. The susceptor 20 is raised at one edge by post 25 so as little of the susceptor 20 as possible is touching the tube 12. This susceptor 20 is propped up to minimize heat loss by conduction through the tube 12 since the tube 12 is cooler than its interior and acts as a heat sink.

When the Si wafer is in place on the susceptor 20 a stream of pure hydrogen ($H_2$) gas is introduced into the interior of tube 12 housing the Si wafer. The induction coil 15 is turned on and the Si wafer 16 and the area therearound is brought to between 1370° C. and 1405° C. After thermal equilibrium is established in the tube 12, propane gas, $C_3H_8$, is added to the $H_2$ stream. The $C_3H_8$ added to the $H_2$ stream should be no greater than 1 percent by volume of the $H_2$ stream. The inclusion of $C_3H_8$ in the $H_2$ stream is for 5–30 seconds and preferably 15 seconds, followed by exclusion of the $C_3H_8$ and quenching to room temperature of the Si wafer 16 in pure $H_2$. While the $C_3H_8$ is present in the tube 12, the carbon in the $C_3H_8$ chemically reacts with the Si wafer 16 to form SiC according to the following equations:

$$C_3H_8 = 3C + 4H_2 \quad \text{(I)}$$

$$3C + 3Si = 3SiC \quad \text{(II)}.$$

At the temperature of between 1370° C. and 1405° C., the SiC that forms is cubic and single crystal. Care should be taken to avoid going higher than 1405° C. because hexagonal, 2H SiC crystals form, or lower than 1370° C. because crystal quality becomes very poor.

After quenching, the Si substrate now supporting the SiC buffer layer is re-heated to between 1370° C. and 1405° C. in pure $H_2$ gas. Again, thermal equilibrium is allowed to occur after which time silane ($SiH_4$) and propane are introduced into the $H_2$ that is flowing past the Si substrate with the SiC buffer layer. The amount of $SiH_4$ in the $H_2$ should be 1% by volume of the $H_2$, and the amount of $C_3H_8$ in the $H_2$ should be 1% volume of the $H_2$. The presence of $SiH_4$ and $C_3H_8$ is continued for as long as desired, usually between 0.25 and 5 hours, depending on how thick a cubic SiC layer is wanted. For instance, at 1400° C., the growth rate of cubic SiC on the buffer layer is about 4 m/hr and is large enough to obtain cubic SiC layers of the thickness needed for device fabrication in less than an hour. The presence of $C_3H_8$ and $SiH_4$ in the gas flowing around the Si substrate is discontinued after the desired time has elapsed. The Si substrate with the cubic SiC layer is then quenched in $H_2$ gas to room temperature. It should be noted that a higher temperature during the CVD process favors formation of more perfect cubic single crystal layers.

A preferred embodiment of many possible embodiments, requires the CVD process to take place in a horizontal, water cooled, rf induction-heated quartz-tube reactor 12 with an internal diameter of 40 mm. An open 35-mm-i.d. quartz liner 33 contains the susceptor 20. The susceptor is machined from high-density, isotropic, high-purity graphite. Prior to the susceptor's first use, it is coated with SiC. The Si substrate 16 rests within a 0.25 mm deep cavity (not shown) in the susceptor 20. The substrate 16 is often (100)-oriented P-type Si, with resistivity of about 150 ohm-cm, measuring 12 mm×25 mm×0.38 mm. The substrate 16 is heated to 1400° C. with a flow of 0.6 liters per minute of $H_2$ passing around the substrate 16. At thermal equilibrium 0.2 milliliters per minute of $C_3H_8$ is added to the flow of $H_2$ for 15 seconds to form the buffer layer, after which time, the $C_3H_8$ flow is discontinued and the substrate 16 is quenched to room temperature in the $H_2$ gas that has continued to flow. The cubic SiC buffer layer that forms is about 300 A thick.

The substrate with the buffer layer is then heated to 1400° C. in the $H_2$ gas which is flowing at 1.4 liters per minute through the tube 12. At thermal equilibrium 1.2 milliliters per minute of $C_3H_8$ and 0.6 milliliters per minute of $SiH_4$ are added to the flow of $H_2$. This mixture is maintained for 2 hours forming an 8 m thick cubic SiC layer. The $C_3H_8$ and $SiH_4$ flow is the $H_2$ gas is discontinued and the Si substrate with a cubic SiC layer is quenched to room temperature in the $H_2$ gas. The Si may be melted at 1420° C. (SiC does not) or the Si may be dissolved in white etch (the SiC does *not* dissolve) in order to remove the SiC layer 18 from the Si layer 16 after completion of CVD.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing large-area cubic SiC wafers comprising the steps of:

wet-etching an Si substrate;

heating the Si substrate to between 1370° C. and 1405° C. in $H_2$ gas;

exposing the Si substrate to $C_3H_8$ for 5–30 seconds, after temperature equilibrium in the heating step has been reached, to form a buffer layer of single crystal cubic SiC on the Si substrate, the amount of $C_3H_8$ being no greater than 1% by volume of the $H_2$ gas;

quenching to room temperature the Si substrate having a cubic SiC buffer layer in a gas of $H_2$;

heating the Si substrate with the SiC buffer layer to between 1370° C. and 1405° C. in $H_2$ gas;

exposing the Si substrate having the buffer layer to $C_3H_8$ and $SiH_4$ after thermal equilibrium has been reached in the second heating step for 0.25 to 5 hours to make a thicker layer of cubic SiC, the amount of $C_3H_8$ and $SiH_4$ each being no greater than 1% by volume of the $H_2$ gas; and quenching the Si substrate having the thicker layer of SiC in $H_2$ gas to room temperature.

2. A method as described in claim 1 wherein the wet-etching step is carried out in a mixture of nitric, hydrofluoric and acetic acid in a volume ratio of 5:3:3, respectively.

3. A method as described in claim 2 wherein after the wet-etching step, there is an additional step of placing the wet-etched Si substrate on a graphite susceptor inside an rf-induction heated quartz tube.

* * * * *